United States Patent [19]
Johnson et al.

[11] 4,048,567
[45] Sept. 13, 1977

[54] BROAD BAND MICROWAVE RECEIVER GAIN CALIBRATOR

[75] Inventors: Edgar A. Johnson, Tujunga; Bruce L. Myers, Inglewood, both of Calif.

[73] Assignee: The Singer Company, New York, N.Y.

[21] Appl. No.: 642,931

[22] Filed: Dec. 22, 1975

[51] Int. Cl.² .................................... H03B 21/00
[52] U.S. Cl. .................................... 325/363; 331/47
[58] Field of Search ............. 325/67, 363, 398, 105, 325/146, 131, 141; 331/47 R, 48 R, 47, 48

[56] References Cited

U.S. PATENT DOCUMENTS

| | | | |
|---|---|---|---|
| 3,140,454 | 7/1964 | Winston et al. | 325/131 |
| 3,783,388 | 1/1974 | Disinger | 325/363 |
| 3,806,811 | 4/1974 | Thompson | 325/363 |

Primary Examiner—Robert L. Griffin
Assistant Examiner—Tommy P. Chin
Attorney, Agent, or Firm—Edward L. Bell; Robert E. Smith; Charles R. Lewis

[57] ABSTRACT

Narrow amplitude calibrated pulses are injected into the RF input ports of microwave receivers such as those used for interference and intensity measurements to gain calibrate the receivers. The upper frequency limit of the prior art calibration source is greatly extended by frequency modulating the pulse generator to obtain pulses that vary in repetition rate between 95 and 105 MHz so that beginning with the tenth harmonic, a continuous band of pulses of predetermined amplitude sweeps from 950 MHz up to approximately 18 GHz.

3 Claims, 1 Drawing Figure

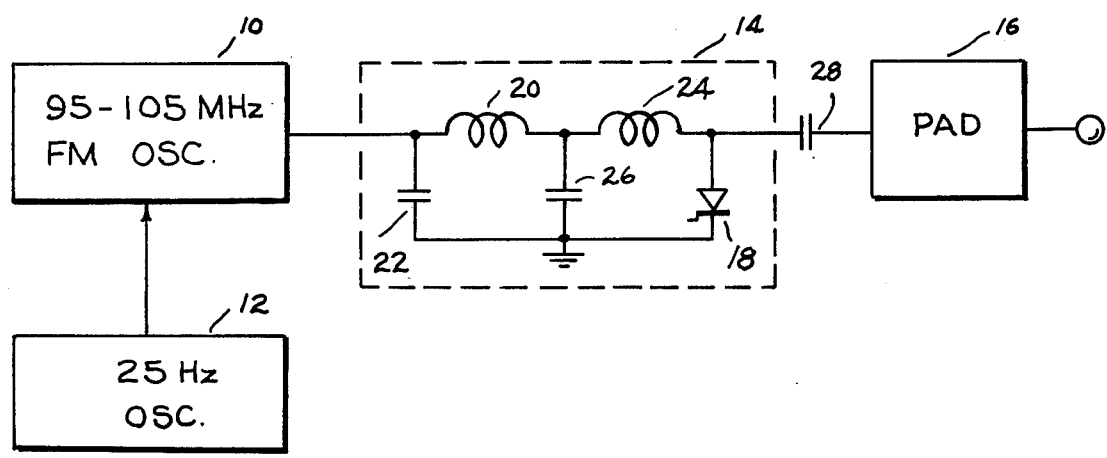

BROAD BAND MICROWAVE RECEIVER GAIN CALIBRATOR

Instruments used for RF interference or field intensity measurements are carefully calibrated precision radio frequency receivers that are operated by selecting a desired frequency, or its harmonics, on the frequency tuning scale and then noting the amplitude of the received signal on an output meter. In order to assure constant accuracy, most instruments of this type are provided with a calibration mode which, when employed, actuates calibration circuitry that injects a train of narrow wave pulses into the RF input port, or antenna of the instrument. The amplitudes of these pulses and their harmonics must be carefully calibrated by the manufacturer at many points in the frequency spectrum of the instrument, so that during the life of the instrument, proper calibration can be obtained by the user by merely adjusting the receiver gain so that the output meter indicates the level prescribed by the manufacturer at that particular frequency.

In theory, if the calibration pulse is square and sufficiently narrow, it will produce an infinite number of harmonics with the higher harmonics being reduced in amplitude according to the Fourier series. In actual practice, the amplitudes of the harmonics decay to the point where they are unreadable at approximately 2 GHz and are usable as calibration pulses only up to a frequency of approximately 1 GHz.

In the present invention, the calibrator provides a continuous calibration band over the entire range of the receiver. The calibration band is produced by generating a series of pulses of approximately 50 picoseconds width at a pulse rate of approximately 10 nanoseconds but which varies in rate because the pulses are generated from a frequency modulated oscillator varying between 95 and 105 MHz at a sweep frequency of approximately 25 Hz.

Because the pulse frequency is being varied, the harmonics of the pulses similarly shift in frequency and overlap to provide a continuously varying band passing through all frequencies within the range of the receiver.

The single FIGURE of the drawings is a block diagram of the calibration source with the pulse generating circuit schematically illustrated.

As illustrated in the figure, the calibration source includes an oscillator 10 which varies between a frequency of 95 and 105 MHz by a modulating oscillator 12 that operates at a frequency of approximately 25 Hz. The output of the frequency modulated oscillator 10 is applied to the input of an impulse generator 14 which produces narrow square wave pulses upon the occurrence of each cycle generated by oscillator 10. The output of the impulse generator 14 is applied through a conventional pad 16 to the output terminal of the calibration circuitry.

The impulse generator 14 inclused a step recovery diode 18 in circuit with a matching network comprising an inductance 20 and capacitance 22 and a drive network including an inductance 24 and a capacitance 26. As illustrated in the drawing, inductance 20, inductance 24 and a blocking capacitor 28 are in series between the input terminal and output terminal of the impulse generator 14. Capacitor 22 is coupled between the input terminal and ground, capacitor 26 is coupled between ground and the junction between inductances 20 and 24, and the step recovery diode 18 is coupled between ground and the junction between inductance 24 and blocking capacitor 28.

In the embodiment being described, the valves selected for the network elements of the impulse generator 14 were: inductance 20: 12 nanohenry; inductance 24: 1.8 nanohenry; capacitance 22: 210 pfd; capacitor 26: 1390 pfd.

With the valves selected, as indicated above, the impulse generator 14 will generate a pulse having a width of approximately 50 picoseconds upon the occurrence of each cycle generated by the frequency modulated oscillator 10. It should be noted that step recovery diodes such as the diode 18 in the impulse generator circuit 14 are the development of the Hewlett-Packard Company and that details of the step recovery diode characteristics and applications may be found in various publications such as "The Hewlett-Packard Company Application Notes", AN-920. The circuitry contained in the impulse generator 14 is illustrated and described in AN-920 at Pages 8 and 9.

In operation, the circuitry of the invention generates a narrow square wave pulse upon the occurrence of each cycle of the frequency modulated oscillator 10. Thus, since oscillator 10 operates at a fundamental frequency of 100 MHz with a frequency swing between 95 and 105 MHz (or 1/10 of the fundamental frequency), a continuous band of calibration pulses will be generated beginning with the tenth harmonic which will vary between 950 and 1050 MHz. The eleventh harmonic would vary between 1045 and 1155 MHz, the twelfth between 1140 and 1260, etc. Therefore. beginning at a pulse frequency of 950 MHz, there is a continuous and overlapping band of pulses extending to the upper limit of microwave frequency to be calibrated. In actual practice, the circuitry described generates consistence and accurate calibration pulses up to approximately the 150th harmonic; above the point, amplitudes begin to deteriorate to the point where, at 18 GHz, calibration is possible but difficult.

The circuitry has been described for gain calibrating microwave receiver equipment operating in the range 1 to 18 GHz and the circuitry employs a frequency oscillator 10 having a fundamental frequency that is 1/10 of the lowest range of the receiver to be calibrated that operates with a frequency swing of 1/10 of the fundamental frequency of oscillator 10. If it is desired to calibrate receivers operating in a different frequency range and/or operate oscillator 10 at a different fundamental frequency, a continuous band of calibration pulses may be generated beginning at any desired harmonic of frequency modulated oscillator 10 if the total frequency swing of the oscillator is 1/N the fundamental frequency of the oscillator, where N is the desired harmonic. As will be obvious from the above, the fundamental frequency will be the Nth subharmonic of the lowest frequency of the frequency band.

What is claimed is:

1. A gain calibrator for generating a continuous band of calibration pulses of determinable amplitude over a wide calibration range of radio frequencies, said calibrator comprising:

a frequency modulated signal source having a fundamental frequency that is the Nth subharmonic of the lowest radio frequency in the calibration range, the frequency modulated output of said signal source having a total frequency swing of 1/N of said fundamental frequency;

a low frequency oscillator coupled to modulate said signal source; and an impulse generator including a step recovery diode coupled to the output of said signal source for producing a continuous and overlapping band of pulses beginning at the lower frequency end of said calibration band and extending to the upper frequency limit of said calibration band.

2. The calibrator claimed in claim 1 wherein said signal source generates a fundamental frequency of 100 MHz with a total frequency swing of 10 MHz.

3. The calibrator claimed in claim 2 wherein said low frequency oscillator modulates said signal source at a frequency of approximately 25 Hz.

* * * * *